United States Patent
Shin et al.

(10) Patent No.: US 10,502,792 B2
(45) Date of Patent: Dec. 10, 2019

(54) METHOD FOR EVALUATING INSULATING PERFORMANCE OF SEPARATOR FOR ELECTROCHEMICAL DEVICE

(71) Applicant: LG CHEM, LTD., Seoul (KR)

(72) Inventors: Hyun-Kyung Shin, Daejeon (KR); Dong-Wook Sung, Daejeon (KR); Sang-Joon Lee, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 16/285,926

(22) Filed: Feb. 26, 2019

(65) Prior Publication Data

US 2019/0265305 A1 Aug. 29, 2019

(30) Foreign Application Priority Data

Feb. 26, 2018 (KR) .................. 10-2018-0023048

(51) Int. Cl.
*G01R 31/389* (2019.01)
*H01M 10/42* (2006.01)
(Continued)

(52) U.S. Cl.
CPC ......... *G01R 31/389* (2019.01); *G01R 31/378* (2019.01); *H01M 2/145* (2013.01);
(Continued)

(58) Field of Classification Search
CPC ... G01R 31/389; G01R 31/378; H01M 2/145; H01M 2/16; H01M 10/4285; H01M 10/488
See application file for complete search history.

(56) References Cited

U.S. PATENT DOCUMENTS

| 4,906,939 | A | * | 3/1990 | Berrigan | .................. | G01R 1/04 |
| | | | | | | 324/548 |
| 8,018,233 | B2 | * | 9/2011 | Iwanaga | ................. | H01M 6/50 |
| | | | | | | 205/335 |

(Continued)

FOREIGN PATENT DOCUMENTS

| JP | 2008270090 A | * | 11/2008 | ............. | H01M 6/50 |
| JP | 2009009812 A | * | 1/2009 | ............. | H01M 6/50 |

(Continued)

*Primary Examiner* — Jeff W Natalini
(74) *Attorney, Agent, or Firm* — Morgan, Lewi & Bockius LLP (57) ABSTRACT

A method for evaluating the insulating performance of a separator using an insulating performance evaluation system according to an exemplary embodiment of the present disclosure includes: preparing a measurement subject wherein a metal contact layer is interposed between two sheets of separator so as to form a plurality of local contacts with the surface of the separator; sandwiching the measurement subject between an upper jig and a lower jig; applying a voltage the magnitude of which varies with time between the upper jig and the lower jig using a voltage application unit; receiving a current measurement value flowing between the upper jig and the lower jig as an input from a current measurement unit; and determining the voltage value at which the current measurement value is equal to or greater than a preset critical value as a dielectric breakdown voltage, by a control unit.

15 Claims, 6 Drawing Sheets

(51) Int. Cl.
  *H01M 2/14*   (2006.01)
  *G01R 31/378*  (2019.01)
  *H01M 2/16*   (2006.01)
  *H01M 10/48*  (2006.01)

(52) U.S. Cl.
  CPC ......... *H01M 2/16* (2013.01); *H01M 10/4285* (2013.01); *H01M 10/488* (2013.01)

(56) References Cited

U.S. PATENT DOCUMENTS

| | | | |
|---|---|---|---|
| 2001/0019270 A1* | 9/2001 | Onishi | H01M 10/0413 |
| | | | 324/426 |
| 2011/0143182 A1* | 6/2011 | Davis | H01M 2/162 |
| | | | 429/144 |
| 2012/0186071 A1* | 7/2012 | Yamashita | H01G 11/06 |
| | | | 29/593 |
| 2016/0365559 A1 | 12/2016 | Yoshimaru et al. | |
| 2016/0372728 A1 | 12/2016 | Yoshimaru et al. | |

FOREIGN PATENT DOCUMENTS

| | | | | |
|---|---|---|---|---|
| JP | 2009-158266 A | | 7/2009 | |
| JP | 2009-243929 A | | 10/2009 | |
| JP | 2010-287682 A | | 12/2010 | |
| JP | 2012505513 A | * | 1/2013 | ............ H01M 10/48 |
| JP | 2013190220 A | * | 9/2013 | ............. H01M 2/14 |
| JP | 2013-201155 A | | 10/2013 | |
| JP | 2014-003071 A | | 1/2014 | |
| KR | 10-1431952 B1 | | 8/2014 | |
| KR | 10-2016-0102331 A | | 8/2016 | |
| KR | 10-2017-0014887 A | | 2/2017 | |
| KR | 10-2017-0113692 A | | 10/2017 | |

* cited by examiner

METHOD FOR EVALUATING INSULATING PERFORMANCE OF SEPARATOR FOR ELECTROCHEMICAL DEVICE

TECHNICAL FIELD

The present application claims priority to Korean Patent Application No. 10-2018-0023048 filed on Feb. 26, 2018 in the Republic of Korea, the disclosures of which are incorporated herein by reference.

The present disclosure relates to a method for evaluating the insulating performance of a separator that can be used for an electrochemical device such as a lithium secondary battery, etc., more particularly to a method for evaluating the insulating performance of a separator by interposing a metal contact layer between two sheets of separator.

BACKGROUND ART

Recently, interests in the energy storage technology are increasing gradually. As the application areas expand toward mobile phones, camcorders, notebook PCs and electric vehicles, efforts for research and development of electrochemical devices are being materialized more and more.

The electrochemical devices are drawing attentions the most in this aspect. In particular, the focus of development is on rechargeable secondary batteries. Recently, with regard to the development of secondary batteries, research and development are being carried out actively on the design of new electrodes and batteries for improvement of capacity density and specific energy.

Among the currently used secondary batteries, the lithium secondary battery developed in the early 1990s is appreciated due to the advantages of higher operating voltage and outstandingly hither energy density as compared to the conventional batteries using aqueous electrolytes, such as Ni-MH, Ni—Cd or sulfuric acid-lead batteries.

A separator used in the lithium secondary battery serves to physically block the contact between a positive electrode and a negative electrode while allowing the transport of lithium ions and to electrically insulate the positive electrode and the negative electrode. Particularly, the separator is known to have a significant effect on the characteristics and safety of the battery because it maintains insulation for preventing internal short circuits.

Hitherto, the dielectric breakdown voltage of the separator itself was measured in order to evaluate the insulating performance of the separator. Specifically, after sandwiching the separator between an upper jig and a lower jig and applying a voltage between the two jigs, the voltage at which a current above a reference value flew through the separator was measured as the dielectric breakdown voltage.

However, only the insulating performance of the separator itself could be measured and the dielectric breakdown voltage of an electrode assembly wherein the separator is laminated with electrodes could not be measured. The separator contained in the electrochemical device is laminated with the electrodes during the assemblage of the electrode assembly. This lamination includes a process of laminating the separator with the electrodes coated with active material particle layers and then compressing the same using a roller. The dielectric breakdown voltage is different before and after the lamination because the separator is deformed during this process. It is because fine unevenness is formed on the surface of the separator while the active material particles present on the electrode surface and the separator are compressed, leading to variation in thickness throughout the surface. In addition, if the electrode active material particles are deintercalated or foreign impurities such as metal dust, etc. are interposed between the separator and the electrodes during the lamination process, the dielectric breakdown voltage may be changed. In this case, the insulating performance worsens as the thickness of the region of the separator contacting with the impurities is decreased. It is because resistance is decreased locally at the region with the decreased thickness. However, with the existing method, the difference of the dielectric breakdown voltage of the separator itself and the dielectric breakdown voltage of the separator after the lamination could not be measured.

Meanwhile, Korean Patent Publication No. 10-2016-0102331 discloses a method of interposing a sheet of negative electrode and a sheet of separator between two jigs and measuring dielectric breakdown voltage by measuring the resistance when a nail passes therethrough. However, with this method, it is difficult to determine whether the dielectric breakdown voltage is due to the separator or due to the electrode.

DISCLOSURE

Technical Problem

The present disclosure is designed to solve the problems of the related art, and therefore the present disclosure is directed to providing a method capable of evaluating the insulating performance of a separator for an electrochemical device using a measurement subject simulating a separator laminated with electrodes.

However, it will be easily understood that the object of the present disclosure is not limited thereto and other objects may be clearly understood by those skilled in the art from the detailed description of the present disclosure given below.

Technical Solution

In one aspect of the present disclosure, there is provided a method for evaluating the insulating performance of a separator for an electrochemical device according to the following exemplary embodiments.

A first exemplary embodiment relates to a method for evaluating the insulating performance of a separator for an electrochemical device, which includes:

(a) a step of preparing a measurement subject wherein a metal contact layer is interposed between two sheets of separator so as to form a plurality of local contacts with the surface of the separator;

(b) a step of sandwiching the measurement subject between an upper jig and a lower jig;

(c) a step of applying a voltage the magnitude of which varies with time between the upper jig and the lower jig using a voltage application unit;

(d) a step of receiving a current measurement value flowing between the upper jig and the lower jig as an input from a current measurement unit; and (e) a step of determining the voltage value at which the current measurement value is equal to or greater than a preset critical value as a dielectric breakdown voltage, by a control unit.

A second exemplary embodiment relates to the method for evaluating the insulating performance of a separator for an electrochemical device according to the first exemplary embodiment, wherein the metal contact layer is formed of a metal mesh, and the step (a) includes: a step of inserting the metal mesh between two sheets of separator; and a step of forming a plurality of local contacts between the separator and the metal mesh by thermally compressing the two sheets of separator having the metal mesh inserted.

A third exemplary embodiment relates to the method for evaluating the insulating performance of a separator for an electrochemical device according to the first exemplary embodiment, wherein the metal contact layer is formed of a metal particle layer containing a plurality of metal particles, and the step (a) includes: a step of scattering the plurality of metal particles onto one of the two sheets of separator; and a step of forming a plurality of local contacts between the separator and the plurality of metal particles by positioning the other separator on the separator onto which the plurality of metal particles have been scattered.

A fourth exemplary embodiment relates to the method for evaluating the insulating performance of a separator for an electrochemical device according to the first exemplary embodiment, wherein the metal contact layer is formed of a metal particle layer containing a plurality of metal particles and an organic binder binding them, and the step (a) includes: a step of preparing a slurry containing the plurality of metal particles, the organic binder and a volatile solvent; a step of forming a metal contact layer by coating the slurry onto one of the two sheets of separator and drying the same; and a step of forming a plurality of local contacts between the separator and the plurality of metal particles by positioning the other separator on the separator onto which the metal contact layer has been formed and then thermally compressing the two sheets of separator.

A fifth exemplary embodiment relates to the method for evaluating the insulating performance of a separator for an electrochemical device according to any of the first exemplary embodiment through the fourth exemplary embodiment, wherein the area of the metal contact layer is 60-70% of the total area of the separator, and the metal contact layer is formed with a predetermined spacing from the edge of the separator.

A sixth exemplary embodiment relates to the method for evaluating the insulating performance of a separator for an electrochemical device according to the second exemplary embodiment, wherein the metal mesh has a diameter of a weft and a warp of 15-2000 μm and a gap between the weft and the warp of 15-10000 μm.

A seventh exemplary embodiment relates to the method for evaluating the insulating performance of a separator for an electrochemical device according to the third exemplary embodiment or the fourth exemplary embodiment, wherein the metal particle contained in the metal particle layer has a size of 15-1000 μm.

An eighth exemplary embodiment relates to the method for evaluating the insulating performance of a separator for an electrochemical device according to any of the first exemplary embodiment through the seventh exemplary embodiment, wherein, in the step (e), when the current measurement value is equal to or greater than the critical value for a preset reference time, the control unit determines the voltage value measured immediately after the reference time has passed as a dielectric breakdown voltage.

A ninth exemplary embodiment relates to the method for evaluating the insulating performance of a separator for an electrochemical device according to any of the first exemplary embodiment through the eighth exemplary embodiment, which further includes, between the step (a) and the step (b), a step of interposing metal foils between the measurement subject and the upper jig and between the measurement subject and the lower jig.

A tenth exemplary embodiment relates to the method for evaluating the insulating performance of a separator for an electrochemical device according to any of the first exemplary embodiment through the ninth exemplary, wherein, in the step (c), the measurement subject is compressed by applying pressure to the upper jig and the lower jig.

An eleventh exemplary embodiment relates to the method for evaluating the insulating performance of a separator for an electrochemical device according to any of the first exemplary embodiment through the tenth exemplary embodiment, wherein, in the step (c), at least one of the upper jig and the lower jig is heated.

A twelfth exemplary embodiment relates to the method for evaluating the insulating performance of a separator for an electrochemical device according to the tenth exemplary embodiment, wherein the pressure applied the upper jig and the lower jig is 5 kPa to 30 MPa.

A thirteenth exemplary embodiment relates to the method for evaluating the insulating performance of a separator for an electrochemical device according to any of the first exemplary embodiment through the twelfth exemplary embodiment, which further includes a step of recording the determined dielectric breakdown voltage in a storage unit.

A fourteenth exemplary embodiment relates to the method for evaluating the insulating performance of a separator for an electrochemical device according to any of the first exemplary embodiment through the thirteenth exemplary embodiment, which further includes a step of displaying the determined dielectric breakdown voltage by a display unit.

A fifteenth exemplary embodiment relates to the method for evaluating the insulating performance of a separator for an electrochemical device according to any of the first exemplary embodiment through the fourteenth exemplary embodiment, wherein the voltage is a DC voltage or a pulse voltage the magnitude of which increases with time.

Advantageous Effects

According to the present disclosure, the insulating performance of a separator for an electrochemical device can be evaluated using a measurement subject wherein a metal contact layer is interposed between two sheets of separator so as to form a plurality of local contacts with the surface of the separator, by sandwiching the measurement subject between two jigs, measuring a voltage between the two jigs and then measuring current flowing between the jigs.

According to the method for evaluating insulating performance, the insulating performance of a separator laminated with electrodes can be evaluated with reliability.

According to an exemplary embodiment of the present disclosure, the dielectric breakdown voltage characteristics of an electrode assembly can be investigated without using a high-pressure apparatus.

BEST MODE

Hereinafter, the present disclosure is described in detail with reference to the accompanying drawings. It should be understood that the terms used in the specification and the appended claims should not be construed as limited to general or dictionary meanings, but should be interpreted based on the meanings and concepts corresponding to technical aspects of the present disclosure on the basis of the principle that the inventor is allowed to define terms appropriately for the best explanation.

Therefore, the exemplary embodiments described in the specification and illustrated in the drawings are just preferable examples of the present disclosure. It should be understood that they do not represent all the technical aspects of the present disclosure and various equivalents and modifications could replace them.

Figure 1:
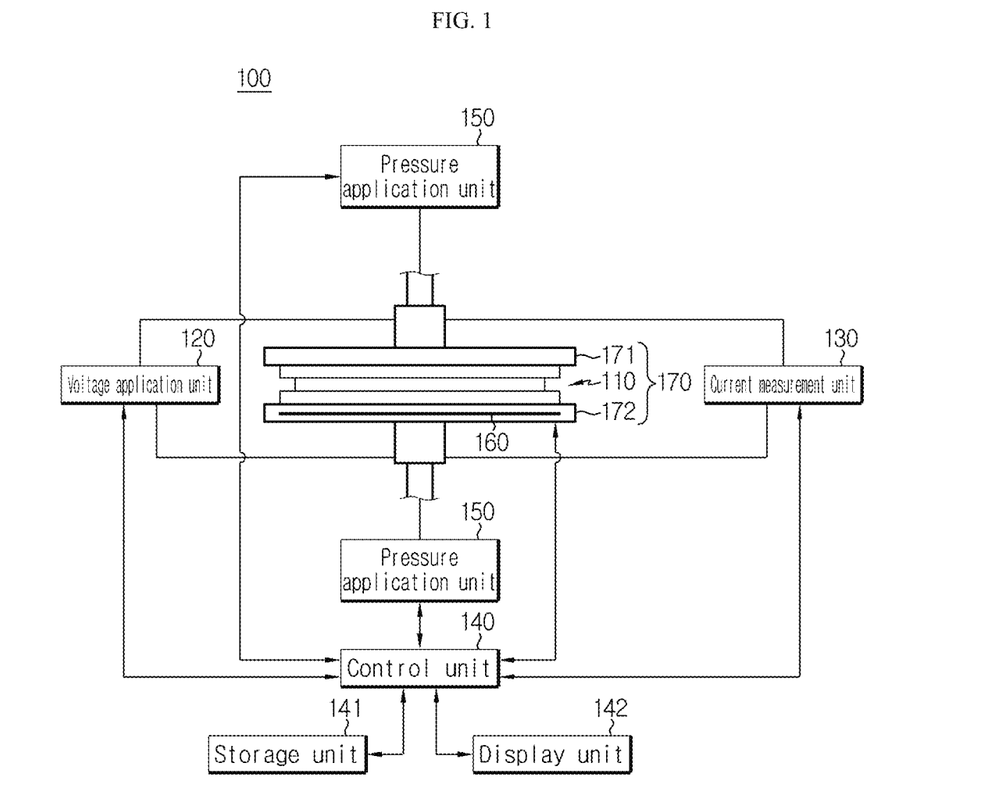
FIG. 1 shows the configuration of a system for evaluating the insulating performance of a separator according to an exemplary embodiment of the present disclosure.

First, the overall configuration of a system for evaluating the insulating performance of a separator according to an exemplary embodiment of the present disclosure is described referring to FIG. 1.

FIG. 1 shows the configuration of a system for evaluating the insulating performance of a separator according to an exemplary embodiment of the present disclosure.

Referring to FIG. 1, a system 100 for evaluating the insulating performance of a separator according to the present disclosure is an apparatus for evaluating the insulating performance of a measurement subject 110 and contains a voltage application unit 120, a current measurement unit 130 and a control unit 140. In addition, the system 100 for evaluating the insulating performance of a separator according to the present disclosure may further contain a pressure application unit 150 and a heating unit 160.

The measurement subject 110 has a metal contact layer interposed between two sheets of separator, wherein the metal contact layer forms a plurality of local contacts with the surface of the separator. Therefore, the measurement subject 110 according to the present disclosure simulates a separator laminated with electrodes.

The insulating performance of a separator changes before and after lamination for the following reason. During the lamination process, electrode active material particles may be deintercalated or foreign impurities such as metal dust, etc. may be interposed between the separator and the electrodes. In this case, the insulating performance worsens as the thickness of the region of the separator contacting with the impurities is decreased. It is because resistance is decreased locally at the region with the decreased thickness. In addition, the electrode surface has fine unevenness according to the shape of the active material particles. This unevenness also causes variation in thickness throughout the entire surface of the separator. The variation in thickness also affects the insulating performance of the separator. It is because the insulating performance is decreased at the region of the separator with the decreased thickness.

In the present disclosure, the metal contact layer is interposed between the two sheets of separator in order to measure the insulating performance of the separator. The metal contact layer functions as an electrode active material layer after the lamination or as impurities formed during the lamination, thereby allowing reliable evaluation of the insulating performance of the separator laminated with electrodes. That is to say, it enables the evaluation of the insulating performance by simulating the actual use environment of the separator.

In an exemplary embodiment, the metal contact layer may be formed of a metal mesh.

The metal mesh simulates an electrode active material layer contacting with the separator and may be any one made of a metal without limitation. The metal mesh is formed by a weft and a warp. The weft and the warp are woven together with predetermined intervals and heights.

Accordingly, if the metal mesh is interposed between two sheets of separator, the regions corresponding to the highest points and lowest points in the trajectory of the weft and the warp form local contacts with the separator surface. These local contacts may simulate the change of the thickness of the separator due to the contact of impurity particles or active material particles with the separator.

Each of the weft and the warp of the metal mesh may have a diameter of 15-2,000 μm, 15-400 μm or 15-40 μm. And, each of the weft and the warp may have a gap of 15-10,000 μm, 15-800 μm or 15-80 μm.

The gap of the weft and the warp refers to the gap between two adjacent wefts and the gap between two adjacent warps. Within the above numerical ranges, the metal mesh may simulate the local change of the thickness of the separator due to impurities or active material particles when the separator is laminated with electrodes.

The measurement subject 110 may be one in which the two sheets of separator with the metal mesh inserted therebetween is thermally compressed to simulate a separator laminated with electrodes. Through this, a plurality of local contacts is formed between the separator and the metal mesh in the measurement subject. The local contacts are formed at the positions corresponding to the highest points and lowest points in the trajectories of the weft and the warp constituting the metal mesh.

In another exemplary embodiment, the metal contact layer may be formed of a metal particle layer containing a plurality of metal particles. The metal particle layer may simulate impurities formed during the lamination of the separator with electrodes or electrode active material particles forming unevenness on the surface of the electrode by forming a plurality of local contacts with the separator.

The metal particles contained in the metal particle layer may have a size of 15-1,000 μm, 50-00 μm or 100-200 μm. Within the above numerical ranges, the metal particles may simulate the local change of the thickness of the separator due to impurities or active material particles when the separator is laminated with electrodes.

The metal particle layer may be formed by scattering the metal particles onto one of the two sheets of separator. In this case, a plurality of local contacts may be formed between the separator and the plurality of metal particles by positioning the other separator on the separator onto which the plurality of metal particles have been scattered.

In another exemplary embodiment, the metal contact layer may be formed of a metal particle layer containing a plurality of metal particles and an organic binder binding them. In this case, the measurement subject 110 may be prepared by coating a slurry containing a plurality of metal particles, an organic binder and a volatile solvent onto the separator and drying the same, thereby obtaining the separator having the metal particle layer wherein the plurality of metal particles are bound by the organic binder formed, positioning the other separator thereon and then conducting thermal compression.

The separator is not limited as long as it physically blocks the contact between a negative electrode and a positive electrode and has electrically insulating property. As the separator, an insulating thin film which is interposed between a positive electrode and a negative electrode and has high ion permeability and mechanical strength may be used. The separator has pores with a pore diameter of 0.01-10 μm in general. The separator may have a thickness of 5-300 μm in general. As non-limiting examples of the separator, a sheet, a nonwoven, etc. made of an olefin-based polymer such as polyethylene, polypropylene, etc., glass fiber, polyethylene, etc., which are chemically resistant and hydrophobic may be used. If necessary, an inorganic coating layer containing inorganic particles may be further formed on the outermost surface of the separator in order to improve the thermal stability of the separator. The separator may also be a solid electrolyte.

In an exemplary embodiment, the area of the metal contact layer may be 60-70% of the total area of the separator, and the metal contact layer may be formed with a predetermined spacing from the edge of the separator.

Referring to FIG. 1, the voltage application unit 120 may be electrically connected to an upper jig 171 and a lower jig 172. That is to say, the voltage application unit 120 may be connected to both ends of the jigs 170. For example, the voltage application unit 120 may be connected directly to the upper jig 171 and the lower jig 172.

The voltage application unit 120 applies a DC voltage between the upper jig 171 and the lower jig 172. Specifically, the voltage application unit 120 applies a voltage the magnitude of which varies with time between the upper jig 171 and the lower jig. The voltage may be a DC voltage the magnitude of which increases with time. The voltage may also be a pulse voltage the magnitude of which increases with time. The voltage application unit 120 is electrically connected to the control unit 140 and applies a DC voltage or a pulse voltage between the upper jig 171 and the lower jig 172 under the control by the control unit 140. The control unit 140 controls the degree of the increase of the voltage with time according to a preset condition.

Specifically, the voltage application unit 120 may be the Chroma Hipot Tester 19052 or the Keithley Model 2400 Series.

The current measurement unit 130 may be electrically connected to the upper jig 171 and the lower jig 172, respectively. That is to say, the current measurement unit 130 may be connected directly to both ends of the jigs 170. For example, the current measurement unit 130 may be connected directly to the upper jig 171 and the lower jig 172.

The current measurement unit 130 measures the current flowing between the upper jig 171 and the lower jig 172.

In the present disclosure, when the voltage application unit 120 applies a voltage across the jigs 170 wherein the measurement subject 110 is sandwiched therebetween, the current flowing between the upper jig 171 and the lower jig 172 is 0 because the measurement subject 110 is an insulator. However, if the voltage value applied by the voltage application unit 120 increases with time, the insulating property of the measurement subject 110 is broken down, and current flows between the upper jig 171 and the lower jig 172. Therefore, the current measurement value measured by the current measurement unit 130 is also increased with time. If the current value measured by the current measurement unit 130 is equal to or greater than a reference value, it means that current flows between the two sheets of separator and the insulating property has been broken down.

Specifically, the current measurement unit 130 may be the Chroma Hipot Tester 19052 or the Keithley Model 2400 Series.

In an exemplary embodiment, the control unit 140 transmits a voltage application command to the voltage application unit 120. Then, the voltage application unit 120 applies a voltage the magnitude of which varies according to a preset condition between the upper jig 171 and the lower jig 172. Also, the control unit 140 periodically receives the voltage value applied between the upper jig 171 and the lower jig 172 from the voltage application unit 120 while the voltage application unit 120 applies the voltage between the upper jig 171 and the lower jig 172.

In addition, the control unit 140 periodically receives the current value flowing between the upper jig 171 and the lower jig 172 from the current measurement unit 130 while the voltage application unit 120 applies the voltage between the upper jig 171 and the lower jig 172. The current value is 0.05 mA or lower if the insulating property of the separator is maintained. The current value increases rapidly if the insulating property of the separator is broken down.

The control unit 140 may store the voltage value and the current value periodically received from the voltage application unit 120 and the current measurement unit 130 in a storage unit 141. It monitors the change of the magnitude of the current value and determines the voltage value applied between the upper jig 171 and the lower jig 172 when the magnitude of the current value is equal to or greater than a preset critical value as a dielectric breakdown voltage.

In the present disclosure, the dielectric breakdown voltage refers to the voltage value when the insulating performance of the measurement subject 110 is broken down while a voltage the magnitude of which varies with time is applied to the measurement subject 110. That is to say, if the magnitude of the voltage applied to the measurement subject 110, which is originally an insulator, increases with time, the measurement subject 110 suddenly exhibits conducting property above a specific value. That is to say, current flows through the measurement subject 110. In the present disclosure, when the current value is maintained to be equal to or greater than a specific critical value for a preset reference time, the voltage value input from the voltage application unit 120 after the reference time has passed is defined as the dielectric breakdown voltage.

Accordingly, the control unit 140 may determine, when the current value input from the current measurement unit 130 is maintained to be equal to or greater than the critical value for a preset reference time, the voltage value input from the voltage application unit 120 immediately after the reference time has passed as the dielectric breakdown voltage.

Specifically, the dielectric breakdown voltage may be measured when the current value flowing through the measurement subject 110 is 0.5 mA or higher and the current value is maintained for 3 seconds or longer. In this case, the dielectric breakdown voltage may be the value input from the voltage application unit 120 immediately after the 3 seconds.

The system 100 according to the present disclosure may further contain the storage unit 141 and/or a display unit 142.

The control unit 140 may receive the voltage value periodically input from the voltage application unit 120 and store it in the storage unit 141. Also, the control unit 140 may store the current value periodically input from the current measurement unit 130 in the storage unit 141.

The storage unit 141 is not specially limited as long as it is a storage medium allowing recording and erasure of information. For example, the storage unit 141 may be RAM, ROM, EEPROM, DRAM, SDRAM, a register, a hard disk, an optical recording medium or a magnetic recording medium. The storage unit 141 may be electrically connected to the control unit 140, for example, by a data bus. The storage unit 141 may store and/or update and/or erase and/or transmit a program containing various control logics executed by the control unit 140 and/or the data generated when the control logics are executed. Theoretically, the storage unit 141 may be divided into two or more parts. The storage unit 141 is not necessarily contained in the control unit 140.

The display unit 142 may output the dielectric breakdown voltage determined for the measurement subject 110 by the control unit 140 through an external display. For example, the measurement result of the insulating performance of the separator after the lamination may be output through a display in the form of text, number, image, etc. The insulating performance measurement result may include the dielectric breakdown voltage, a voltage value change profile, a current value change profile or a combination thereof.

The display unit 142 may be electrically coupled to the control unit 140, and the control unit 140 may output the determined dielectric breakdown voltage or the change profile of the voltage value or the current value with time through the display unit 142. The display unit 142 may be a liquid crystal display, an organic light-emitting diode display or a light-emitting diode display, although the present disclosure is not limited thereby.

In the present disclosure, the pressure application unit 150 may compress the measurement subject 110 by applying pressure to the upper jig 171 and the lower jig 172.

The pressure application unit 150 is coupled to the upper jig 171 and the lower jig 172. The pressure application unit 150 controls the pressure applied to the measurement subject 110 by controlling the distance between the upper jig 171 and the lower jig 172. For instance, as the gap between the upper jig 171 and the lower jig 172 is narrower, the pressure applied to the measurement subject 110 is increased.

The pressure applied by the pressure application unit 150 to the upper jig 171 and the lower jig 172 may be 5 kPa to 30 MPa. This pressure condition may simulate the lamination pressure between electrodes and the separator.

As a non-limiting example, the pressure application unit 150 may be a hydraulic cylinder. In this case, the upper jig 171 and the lower jig 172 are fixed to the end portion of the hydraulic cylinder and the pressure applied to the upper jig 171 and the lower jig 172 is controlled by the upward and downward movement of a rod of the hydraulic cylinder. The control unit 140 may be electrically coupled to the pressure application unit 150, and may control the operation of the pressure application unit 150. Accordingly, the pressure application unit 150 controls the pressure applied between the upper jig 171 and the lower jig 172 according to the control command input from the control unit 140.

In the system 100 according to the present disclosure, the heating unit 160 may be provided at least one of the upper jig 171 and the lower jig 172 opposing each other. The heating unit 160 may heat the measurement subject 110 by heating the jigs. The control unit 140 may be electrically coupled to the heating unit 160, and may control the operation of the heating unit 160. Accordingly, the heating unit 160 heats the measurement subject 110 to a predetermined temperature according to the control command input from the control unit 140.

Specifically, the heating unit 160 may be a heating wire equipped inside the lower jig 172. The heating wire may also be equipped inside the upper jig 171, rather than the lower jig 172, and may also be equipped inside both the upper jig 171 and the lower jig 172. Alternatively, the heating wire may be equipped on the side of the lower jig 172 or the upper jig 171 being in contact with the measurement subject.

The heating unit 160 may simulate the effect of temperature on the insulating performance of the separator laminated with electrodes by heating the measurement subject 110.

The jigs 170 are for sandwiching the measurement subject 110 the insulating performance of which is to be evaluated. The jigs may consist of the upper jig 171 and the lower jig 172, which may be configured to oppose each other.

The jigs 170 may be made of any material as long as they can fix the measurement subject 110. In the system 100 of the present disclosure, the jigs 170 may be made of the same material as a current collector constituting an electrode. For example, if the electrode is a positive electrode, the jig 170 may be made of aluminum. And, if the electrode is a negative electrode, the jig 170 may be made of copper. However, the present disclosure is not limited by the material of the jigs 170.

Specifically, the jigs 170 may be electrical conductors generating potential difference across the measurement subject 110.

When evaluating the insulating performance of the separator using the system 100 for evaluating insulating performance according to the present disclosure, a metal foil may be interposed between the measurement subject 110 and the upper jig 171 and between the measurement subject 110 and the lower jig 172. The metal foil may be for preventing physical damage applied to the jigs as the evaluation of insulating performance is repeated.

The metal foil may be any metal thin film without limitation. Specifically, it may be one have a low interfacial resistance with the jigs. In this aspect, the same material as that of the jigs may be used. For example, copper, aluminum, etc. may be used.

Figure 2:
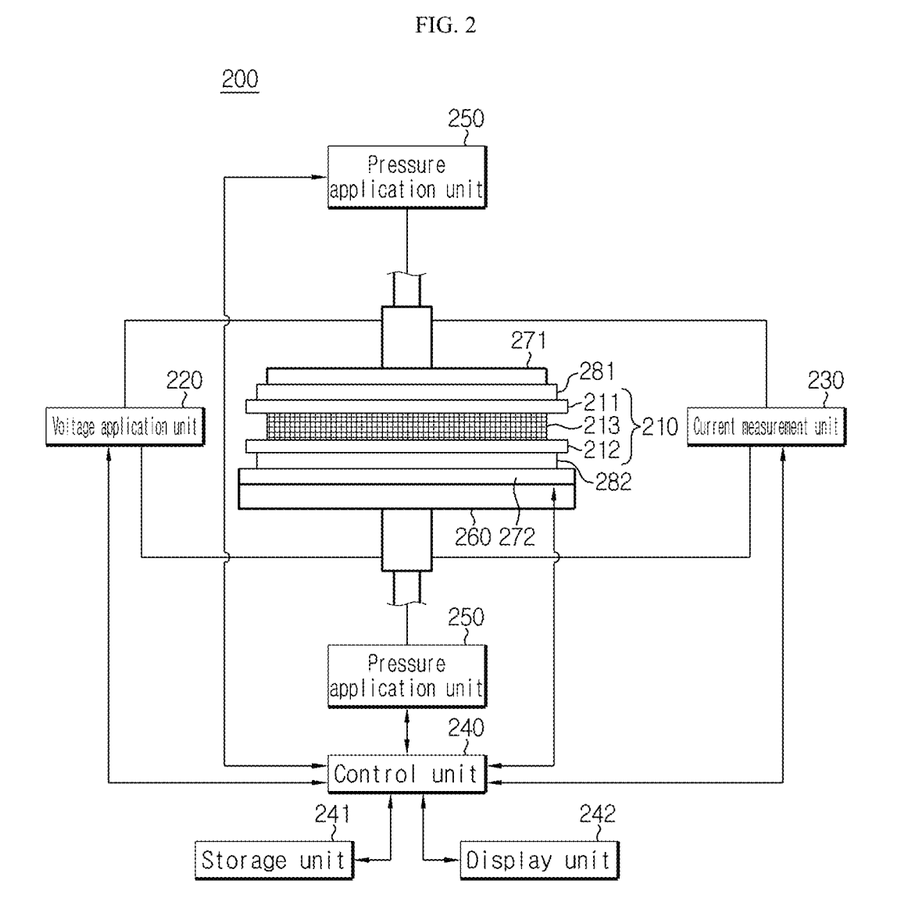
FIG. 2 shows the configuration of an insulating performance evaluation system according to an exemplary embodiment of the present disclosure.

FIG. 2 shows the configuration of an insulating performance evaluation system according to an exemplary embodiment of the present disclosure.

Referring to FIG. 2, a system 200 for evaluating the insulating performance of a separator may contain two jigs 270 opposing each other and a voltage application unit 220, a current measurement unit 230 and a control unit 240 connected to the two jigs 270. In addition, it may further contain a pressure application unit 250 and a heating unit 260.

Referring to FIG. 2, the system 200 for evaluating the insulating performance of a separator may have a measurement subject 210 sandwiched between an upper jig 271 and a lower jig 272.

The measurement subject 210 contains two sheets of separator 211, 212 and a metal contact layer 213 interposed between the two sheets of separator. Specifically, the metal contact layer 213 may be a metal mesh. The metal mesh is the same as described above.

Figure 3:
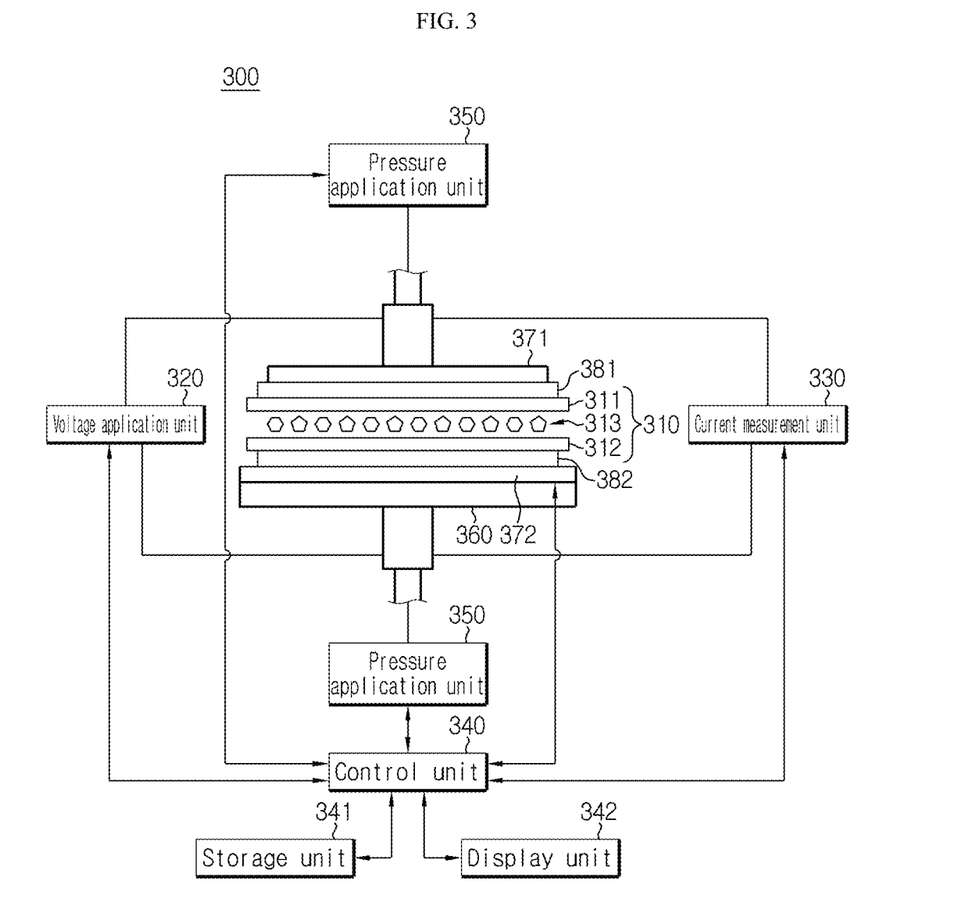
FIG. 3 shows the configuration of an insulating performance evaluation system according to an exemplary embodiment of the present disclosure.

FIG. 3 shows the configuration of an insulating performance evaluation system according to an exemplary embodiment of the present disclosure.

Referring to FIG. 3, a system 300 for evaluating the insulating performance of a separator may contain two jigs 370 opposing each other, a voltage application unit 320 connected to the two jigs 370, a current measurement unit 330 and a control unit 340. In addition, it may further contain a pressure application unit 350 and a heating unit 360.

Referring to FIG. 3, the system 300 for evaluating the insulating performance of a separator may have a measurement subject 310 sandwiched between an upper jig 371 and a lower jig 372.

The measurement subject contains a metal contact layer between two sheets of separator, and the metal contact layer may be a metal particle layer containing a plurality of metal particles or a metal particle layer containing a plurality of metal particles and an organic binder binding them. The metal particle layer is the same as described above.

Figure 4:
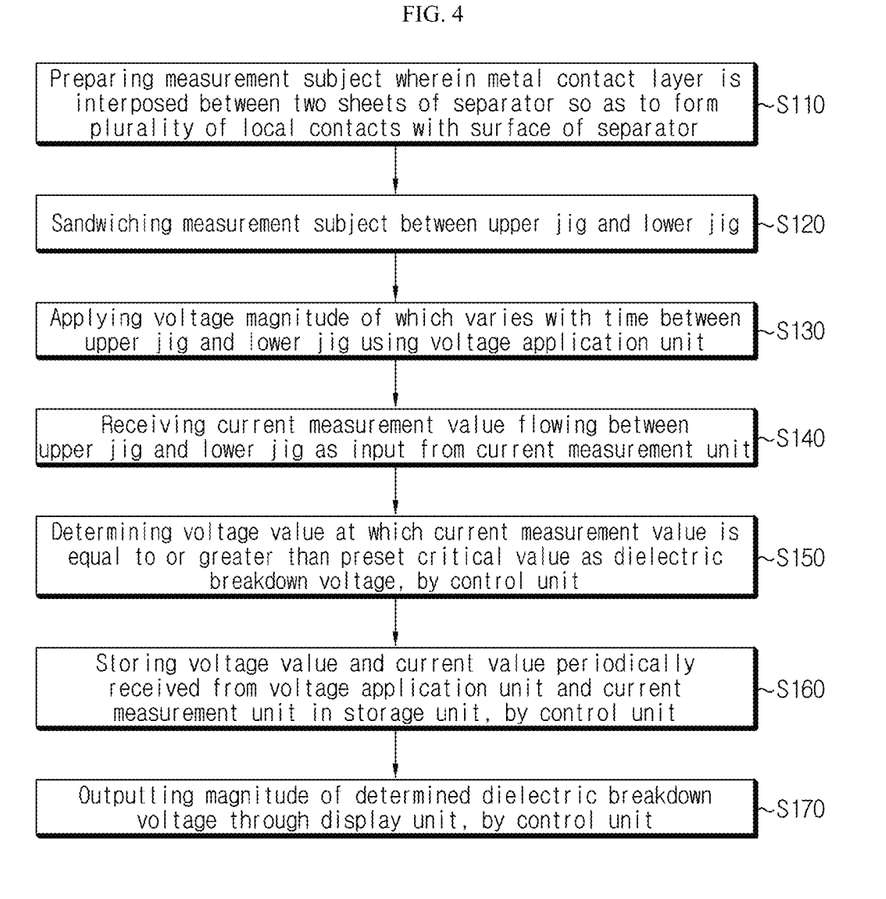
FIG. 4 shows the flow chart of a method for evaluating the insulating performance of a separator.

FIG. 4 shows the flow chart of a method for evaluating the insulating performance of a separator according to an exemplary embodiment of the present disclosure.

Referring to FIG. 1 and FIG. 4, in a method for evaluating the insulating performance of a separator according to the present disclosure, a measurement subject 110 wherein a metal contact layer is interposed between two sheets of separator so as to form a plurality of local contacts with the surface of the separator is prepared first (S110).

The measurement subject contains a metal contact layer, wherein the metal contact layer may be a metal mesh, a metal particle layer containing a plurality of metal particles or a metal particle layer containing a plurality of metal particles and an organic binder binding them.

The metal mesh simulates an electrode active material layer contacting with the separator and may be any one made of a metal without limitation. The metal mesh is formed by a weft and a warp. The weft and the warp are woven together with predetermined intervals and heights.

Accordingly, if the metal mesh is interposed between two sheets of separator, the regions corresponding to the highest points and lowest points in the trajectories of the weft and the warp form local contacts with the separator surface. These local contacts may simulate the change of the thickness of the separator due to the contact of impurity particles or active material particles with the separator.

Each of the weft and the warp of the metal mesh may have a diameter of 15-2,000 μm, 15-400 μm or 15-40 μm. And, each of the weft and the warp may have a gap of 15-10,000 μm, 15-800 μm or 15-80 μm.

The gap of the weft and the warp refers to the gap between two adjacent wefts and the gap between two adjacent warps. Within the above numerical ranges, the metal mesh may simulate the local change of the thickness of the separator due to impurities or active material particles when the separator is laminated with electrodes.

When the metal contact layer is a metal mesh, the measurement subject 110 may be prepared as follows. First, the metal mesh is inserted between two sheets of separator. Then, the two sheets of separator having the metal mesh inserted are thermally compressed. Specifically, the thermal compression may be conducted at a temperature of 50-100° C. under a pressure of 1-30 MPa. Through the thermal compression, a plurality of local contacts may be formed in the measurement subject between the separator and the metal mesh. The local contacts are formed at the positions corresponding to the highest points and lowest points in the trajectories of the weft and the warp constituting the metal mesh.

In another exemplary embodiment, the metal contact layer may be formed of a metal particle layer containing a plurality of metal particles. The metal particle layer may simulate impurities formed during the lamination of the separator with electrodes or electrode active material particles forming unevenness on the surface of the electrode by forming a plurality of local contacts with the separator.

The metal particles contained in the metal particle layer may have a size of 15-1,000 μm, 50-00 μm or 100-200 μm. Within the above numerical ranges, the metal particles may simulate the local change of the thickness of the separator due to impurities or active material particles when the separator is laminated with electrodes.

When the metal contact layer is formed of a metal particle layer containing a plurality of metal particles, the measurement subject 110 may be prepared as follows. First, a plurality of metal particles are scattered onto one of two sheets of separator. Then, the other separator is positioned on the separator onto which the plurality of metal particles have been scattered. For the metal particle layer containing a plurality of metal particles, unlike the metal mesh, a plurality of local contacts may be formed between the separator and the plurality of metal particles even without thermal compression. Of course, the two sheets of separator having the metal particles interposed therebetween may be thermally compressed using a heatable roller.

In another exemplary embodiment, when the metal contact layer is formed of a metal particle layer containing a plurality of metal particles and a binder binding them, the measurement subject 110 may be prepared as follows. First, a slurry containing a plurality of metal particles, an organic binder and a volatile solvent is prepared.

The plurality of metal particles are the same as described above.

The organic binder is not specially limited as long as it is one that can bind metal particles. Non-limiting examples of the organic binder may include polyvinylidene fluoride, polyvinylidene fluoride-co-hexafluoropropylene, polyvinylidene fluoride-co-trichloroethylene, poly(methyl methacrylate), poly(butyl acrylate), polyacrylonitrile, polyvinylpyrrolidone, polyvinyl acetate, polyethylene-co-vinyl acetate, polyethylene oxide, cellulose acetate, cellulose acetate butyrate, cellulose acetate propionate, cyanoethylpullulan, cyanoethyl polyvinyl alcohol, cyanoethyl cellulose, cyanoethyl sucrose, pullulan, etc.

Specifically, the volatile solvent may be one having a solubility similar to that of the organic binder used and having a lower boiling point. In this case, the solvent can be removed easily after homogeneous mixing. Non-limiting examples of the solvent that may be used include water, acetone, tetrahydrofuran, methylene chloride, chloroform, dimethylformamide, N-methyl-2-pyrrolidone, methyl ethyl ketone, cyclohexane and combinations thereof.

Next, the measurement subject 110 may be obtained by coating a slurry containing a plurality of metal particles, an organic binder and a volatile solvent onto one of the two sheets of separator and drying the same so as to form the separator having a metal particle layer wherein the plurality of metal particles are bound by the organic binder. The coating method is not particularly limited. Specifically, slot coating or dip coating may be used. The slot coating is a method of coating the slurry supplied through a slot die onto the whole surface of the separator and the control of coating thickness is possible with the flow rate supplied from a metering pump. The dip coating is a method of coating the separator by dipping in a tank holding the slurry. The coating thickness can be controlled with the concentration of the slurry and the speed of taking the separator out of the slurry tank and post-metering may be conducted using a Mayer bar, etc. after the dipping for more precise control of the coating thickness.

The metal contact layer is formed on at least one side of the separator by drying the slurry-coated separator using an oven or a dryer. Then, after positioning the other separator on the separator having the metal contact layer formed, a plurality of local contacts may be formed between the separator and the plurality of metal particles by thermally compressing the two sheets of separator.

Referring again to FIG. 1 and FIG. 4, after the measurement subject 110 is prepared, the measurement subject 110 is sandwiched between the upper jig 171 and the lower jig 172 (S120). That is to say, the measurement subject 110 is fixed between the jigs 170. The method for fixing is not specially limited.

Subsequently, the control unit 140 applies a DC voltage the magnitude of which varies with time between the upper jig 171 and the lower jig 172 having the measurement subject 110 sandwiched, using the voltage application unit 120 (S130).

During the step S130, the control unit 140 periodically receives a voltage value from the voltage application unit 120 as an input and records it in the storage unit 141 (S160). The voltage value means the magnitude of the DC voltage or the pulse voltage applied between the upper jig 171 and the lower jig 172. The control unit 140 also receives the current value flowing between the upper jig 171 and the lower jig 172 from the current measurement unit 130 as an input and records it in the storage unit 141 (S140).

Subsequently, the control unit 140 determines the voltage value when the magnitude of the current value input from the current measurement unit 130 is equal to or greater than a preset critical value as a dielectric breakdown voltage (S150).

Specifically, the control unit 140 may determine, when the current value input from the current measurement unit 130 is maintained to be equal to or greater than the critical value for a preset reference time, the voltage value input from the voltage application unit 120 immediately after the reference time has passed as the dielectric breakdown voltage.

Optionally, while the DC voltage or the pulse voltage is applied between the upper jig 171 and the lower jig 172 in the step S130, the control unit 140 may apply pressure to the measurement subject 110 by controlling the pressure application unit 150 and, thereby, controlling the gap between the upper jig 171 and the lower jig 172. The pressure may be controlled within a range from 5 kPa to 30 MPa.

Also, optionally, while the DC voltage is applied between the upper jig 171 and the lower jig 172 in the step S130, the control unit 140 may heat the measurement subject 110 to a predetermined temperature by controlling the heating unit 160. The temperature of the measurement subject 110 may be controlled within a range from −200° C. to 150° C.

The control unit 140 may output the magnitude of the determined dielectric breakdown voltage through the display unit 142 (S170). Also, the control unit 140 may display the change profile of the voltage value or the current value periodically input from the voltage application unit 120 through the display unit 142 (S170). The control unit 140 may refer to the voltage value data recorded in the storage unit 141. Also, the control unit 140 may display the change profile of the current value periodically input from the current measurement unit through the display unit 142. The control unit 140 may refer to the current value data recorded in the storage unit 141.

In the present disclosure, the electrochemical device is not particularly limited as long as it has a conductive and porous electrode. For example, it may be used for secondary batteries, supercapacitors, storage batteries, fuel cells, etc.

In a specific exemplary embodiment of the present disclosure, the secondary battery may be a lithium-ion secondary battery, a lithium polymer secondary battery, a lithium metal secondary battery or a lithium-ion polymer secondary battery.

EXAMPLES

Hereinafter, the method for evaluating the insulating performance of a separator for an electrochemical device depending on the structure of a measurement subject is described in detail through examples. However, the examples merely illustrate the present disclosure and the scope of the present disclosure is not limited by them.

Preparation Example 1—Preparation of Separator Having Porous Coating Layer Formed A homogeneous slurry for forming a porous coating layer was prepared at room temperature by adding $Al_2O_3$ inorganic particles (Nippon Light Metal, LS235, particle size 500 nm) and polyvinylidene fluoride-co-hexafluoropropylene as a binder polymer to acetone as a solvent and then stirring the same. The ratio of inorganic particle:binder polymer:solvent was 16:2:82 (weight ratio). Specifically, after adding the binder polymer to acetone and then stirring homogeneously, the slurry for forming a porous coating layer was prepared by adding the inorganic particles.

A separator having a porous coating layer formed was prepared by coating the slurry for forming a porous coating layer onto both sides of a porous polyethylene substrate with a thickness of 7 μm (Asahi Kasei, wet separator, ventilation 160 sec/100 cc) by dip coating and then drying the same. The porous coating layer had a thickness of 2.5 μm. The total thickness of the separator was 12 μm.

Example 1—Metal Mesh SRS A

Two sheets of separator were prepared according to Preparation Example 1. After inserting a metal mesh (Tabu, SUS316L Mesh 300) between the prepared two sheets of separator, the two sheets of separator were thermally compressed for 1 second at a temperature of 70° C. under a pressure of 4 MPa using a flat press equipped with a heater. The metal mesh had a diameter of a weft and a warp of 36 μm, respectively.

Next, the thermally compressed separator was mounted between a pair of jigs opposing each other. During the mounting, a pressure of 10 kPa was applied to the thermally compressed separator, or the measurement subject.

Subsequently, the insulating performance of the measurement subject was evaluated using the separator insulating performance evaluation system and separator insulating performance evaluation method according to the present disclosure.

Figure 5:
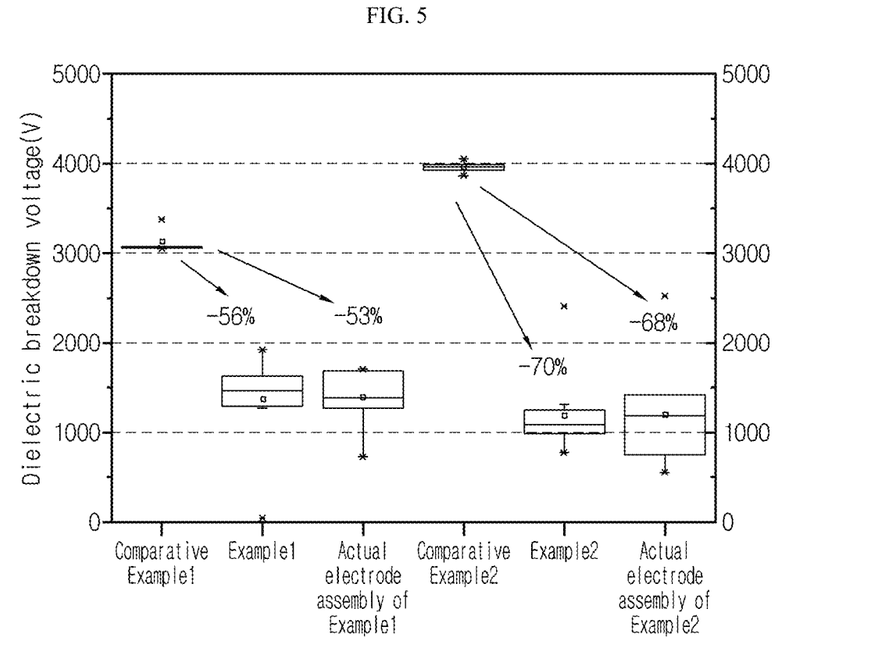
FIG. 5 shows a result of plotting dielectric breakdown voltage when a DC voltage the magnitude of which increases with time is applied to measurement subjects prepared in Examples 1-2 and Comparative Examples 1-2.

From a voltage application unit directly connected to the pair of jigs opposing each other, a DC voltage was applied such that the magnitude of which was increased gradually from 0 V to 5,000 V at a rate of 100 V/sec. The voltage value when the current value measured by a current measurement unit directly connected to the pair of jigs was maintained at 0.5 mA or higher for 3 seconds was determined as a dielectric breakdown voltage. FIG. 5 shows a result of plotting the dielectric breakdown voltage when the DC voltage the magnitude of which increased with time was applied to the measurement subjects prepared in Examples 1-2 and Comparative Examples 1-2.

Comparative Example 1

The two sheets of separator prepared in Preparation Example 1 were laminated at room temperature (25° C.) under 10 kPa. The laminated measurement subject was mounted between jigs. Then, dielectric breakdown voltage was measured in the same manner as in Example 1 except that the separator was used as the measurement subject. FIG. 5 shows a result of plotting the dielectric breakdown voltage when the DC voltage the magnitude of which increased with time was applied to the measurement subjects prepared in Examples 1-2 and Comparative Examples 1-2.

Preparation Example 2—Preparation of Separator Having Porous Coating Layer Formed A homogeneous slurry for forming a porous coating layer was prepared at room temperature by adding $Al_2O_3$ inorganic particles (Nippon Light Metal, LS235, particle size 500 nm) and polyvinylidene fluoride-co-hexafluoropropylene as a binder polymer to acetone as a solvent and then stirring the same. The ratio of inorganic particle:binder polymer:solvent was 17:3:82 (weight ratio). Specifically, after adding the binder polymer to acetone and then stirring homogeneously, the slurry for forming a porous coating layer was prepared by adding the inorganic particles.

A separator having a porous coating layer formed was prepared by coating the slurry for forming a porous coating layer onto both sides of a porous polyethylene substrate with a thickness of 9 μm (Shanghai Energy New Materials Technology, wet separator, ventilation 140 sec/100 cc) by dip coating and then drying the same. The porous coating layer had a thickness of 1.5 μm. The total thickness of the separator was 12 μm.

Example 2—Metal Mesh SRS B

Two sheets of separator were prepared according to Preparation Example 2. After inserting a metal mesh (Tabu, SUS316L Mesh 300) between the prepared two sheets of separator, the two sheets of separator were thermally compressed for 1 second at a temperature of 70° C. under a pressure of 4 MPa using a flat press equipped with a heater. The metal mesh had a diameter of a weft and a warp of 36 μm, respectively.

Next, the thermally compressed separator was mounted between a pair of jigs opposing each other. During the mounting, a pressure of 10 kPa was applied to the thermally compressed separator, or the measurement subject.

Subsequently, the insulating performance of the measurement subject was evaluated using the separator insulating performance evaluation system and separator insulating performance evaluation method according to the present disclosure.

From a voltage application unit directly connected to the pair of jigs opposing each other, a DC voltage was applied such that the magnitude of which was increased gradually from 0 V to 5,000 V at a rate of 100 V/sec. The voltage value when the current value measured by a current measurement unit directly connected to the pair of jigs was maintained at 0.5 mA or higher for 3 seconds was determined as a dielectric breakdown voltage. FIG. 5 shows a result of plotting the dielectric breakdown voltage when the DC voltage the magnitude of which increased with time was applied to the measurement subjects prepared in Examples 1-2 and Comparative Examples 1-2.

Comparative Example 2

The two sheets of separator prepared in Preparation Example 2 were laminated at room temperature (25° C.) under 10 kPa. The laminated measurement subject was mounted between jigs. Then, dielectric breakdown voltage was measured in the same manner as in Example 2 except that the separator was used as the measurement subject. FIG. 5 shows a result of plotting the dielectric breakdown voltage when the DC voltage the magnitude of which increased with time was applied to the measurement subjects prepared in Examples 1-2 and Comparative Examples 1-2.

Example 3—Iron Powder 10 mg of iron powder having a particle size of 50-150 μm was uniformly coated in a circular region with a diameter of 30 mm at the center of the surface of one sheet of separator according to Preparation Example 1. The other separator according to Preparation Example 1 was positioned on the separator having the metal contact layer formed at room temperature (25° C.) without compressing.

Then, a pressure of 10 kPa was applied to the separator, as a measurement subject, after mounting between jigs.

The insulating performance of the measurement subject was evaluated in the same manner as in Example 1 except that the measurement subject containing the two sheets of separator was used.

Comparative Example 3

Figure 6:
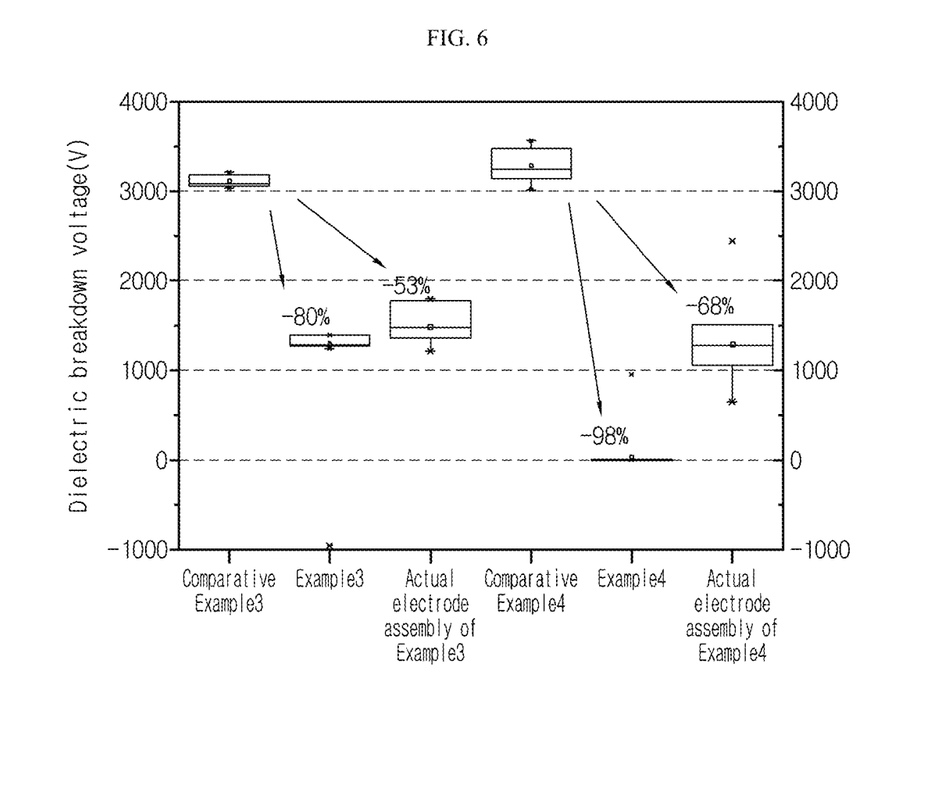
FIG. 6 shows a result of plotting dielectric breakdown voltage when a DC voltage the magnitude of which increases with time is applied to measurement subjects prepared in Examples 3-4 and Comparative Examples 3-4.

The two sheets of separator prepared in Preparation Example 1 were laminated at room temperature (25° C.) under 10 kPa. The laminated measurement subject was mounted between jigs. Then, dielectric breakdown voltage was measured in the same manner as in Example 1 except that the separator was used as the measurement subject. FIG. 6 shows a result of plotting the dielectric breakdown voltage when the DC voltage the magnitude of which increased with time was applied to the measurement subjects prepared in Examples 3-4 and Comparative Examples 3-4.

Example 4—Iron Powder

The insulating performance of a measurement subject was evaluated in the same manner as in Example 1 except that a measurement subject having a metal contact layer interposed was prepared using the separator prepared in Preparation Example 2 and the measurement subject was maintained at a temperature of 25° C. FIG. 6 shows a result of plotting the dielectric breakdown voltage when the DC voltage the magnitude of which increased with time was applied to the measurement subjects prepared in Examples 3-4 and Comparative Examples 3-4.

Comparative Example 4

The two sheets of separator prepared in Preparation Example 2 were laminated at room temperature (25° C.) under 10 kPa. The laminated measurement subject was mounted between jigs. Then, dielectric breakdown voltage was measured in the same manner as in Example 1 except that the separator was used as the measurement subject. FIG. 6 shows a result of plotting the dielectric breakdown voltage when the DC voltage the magnitude of which increased with time was applied to the measurement subjects prepared in Examples 3-4 and Comparative Examples 3-4.

In Examples 1-2, the metal mesh was interposed as the metal contact layer between two sheets of separator as the measurement subject, using different separators. In Comparative Examples 1-2, the separators prepared in Preparation Examples 1-2 were used as the measurement subject. From FIG. 5, when comparing the separators of Comparative Examples 1-2, it can be seen that Comparative Example 2 has a higher dielectric breakdown voltage. However, for Examples 1-2 simulating the separator laminated with electrodes, the opposite result was shown for the dielectric breakdown voltage when compared with Comparative Examples 1-2. Specifically, the dielectric breakdown voltage was higher when the metal mesh was interposed using the separator of Comparative Example 1 (Example 1), which showed a lower dielectric breakdown voltage than the separator of Comparative Example 2. Meanwhile, when the separator of Comparative Example 2 was used (Example 2), the dielectric breakdown voltage was decreased significantly after the lamination.

Also, as can be seen from FIG. 5, Examples 1-2 showed similar tendency as the actual electrode assemblies of Examples 1-2, respectively.

Accordingly, the method for evaluating the insulating performance of a separator according to the present disclosure allows reliable evaluation of the insulating performance of a separator laminated with electrodes.

Example 3 and Example 4 simulate the cases where the metal contact layer is disposed between the separators as the measurement subject and the metal contact layer is formed of a plurality of metal particles. In Comparative Examples 3-4, only the separators prepared in Preparation Examples 1-2 was used as the measurement subject, respectively.

In FIG. 6, Comparative Examples 3-4 show the result of evaluating the dielectric breakdown voltage of the separator itself. Meanwhile, Example 3 and Example 4 simulate the actual electrode assembly by interposing the metal contact layer between the separators. Referring to FIG. 6, it can be seen that, before the lamination of the separator, Comparative Example 4 exhibits higher dielectric breakdown voltage than Comparative Example 3. However, Examples 3 and 4, which simulate the separator laminated with electrodes, show the opposite result for the dielectric breakdown voltage when compared with Comparative Examples 3-4.

When comparing FIG. 5 and FIG. 6, it can be seen that Examples 1-2, wherein the metal mesh was interposed between the separators, simulate the electrode assembly more similarly than Examples 3-4, wherein the iron powder was interposed between the separators. It may be because the diameter of the weft and the warp of the metal mesh according to Examples 1-2 is more similar to the diameter of positive electrode active materials than the particle size of the iron powder according to Examples 3-4.

In Examples 1-2, a pressure of about 4 MPa was applied to the two sheets of separator.

In contrast, in Examples 3-4 wherein the iron powder was used, the two sheets of separator were positioned without compression and a pressure of only 10 kPa was applied when the separator was mounted between the jigs. The 10 kPa was calculated for a smaller jig of the upper and lower jigs.

In Examples 3-4, although the two sheets of separator were positioned without compression, i.e., although a pressure of only 10 kPa was applied, the pressure actually applied between the iron powder and the separator would be higher than 10 kPa. Because the pressure actually applied between the iron powder and the separator is calculated by pressure=load/area, a pressure of 4 MPa or higher is applied to each particle of the iron powder.

Therefore, it is expected that the pressure actually applied in Examples 3-4 will be remarkably higher as compared to Examples 1-2. Accordingly, the dielectric breakdown voltage is measured to be lower for Examples 3-4 as compared to Examples 1-2.

That is to say, Examples 3-4 are for investigating the dielectric breakdown voltage of the electrode assembly without using a high-pressure apparatus.

In the various exemplary embodiments of the present disclosure, the components named using 'unit' should be understood as functionally distinguishable components rather than physically distinguishable components. Therefore, each component may be selectively integrated with another component or may be divided into sub-components for effective execution of control logic(s). However, even when the components are integrated or divided, it will be obviously understood by those skilled in the art that the integrated or divided components should be construed as being included in the scope of the present disclosure as long as functions thereof are maintained constantly.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

DETAILED DESCRIPTION OF MAIN ELEMENTS

110: measurement subject
120: voltage application unit
130: current measurement unit
140: control unit
141: storage unit
142: display unit
150: pressure application unit
160: heating unit
170: jigs
171: upper jig
172: lower jig
210: measurement subject
211: separator
212: separator
213: metal contact layer
220: voltage application unit
230: current measurement unit
240: control unit
250: pressure application unit
260: heating unit
271: upper jig
272: lower jig
281: metal foil
282: metal foil
300: system for evaluating insulating performance of separator
310: measurement subject
311: separator
312: separator
313: metal contact layer 320: voltage application unit
330: current measurement unit
340: control unit
350: pressure application unit
360: heating unit
370: jigs
371: upper jig
372: lower jig
381: metal foil
382: metal foil

What is claimed is:

1. A method for evaluating the insulating performance of a separator for use in blocking contact between positive and negative electrodes in an electrochemical device, comprising:
    preparing a measurement subject having the separator to be evaluated therein, wherein the measurement subject includes a metal contact layer is interposed between two sheets of the separator so as to form a plurality of local contacts with surfaces of each of the two sheets of the separator, and wherein the surface area of the metal contact layer is less than the total surface area of the separator such that the metal contact layer is spaced apart from the edges of each of the two sheets of the separator;
    sandwiching the measurement subject between an upper jig and a lower jig;
    applying a voltage the magnitude of which varies with time between the upper jig and the lower jig using a voltage application unit;
    receiving a current measurement value flowing between the upper jig and the lower jig as an input from a current measurement unit; and
    determining the voltage value at which the current measurement value is equal to or greater than a preset critical value as a dielectric breakdown voltage, by a control unit.

2. The method for evaluating the insulating performance of a separator for an electrochemical device according to claim 1, wherein the metal contact layer of the measurement subject includes a metal mesh, and wherein the preparing the measurement subject comprises:
    inserting the metal mesh between two sheets of the separator; and
    forming the plurality of local contacts between the separator and the metal mesh by thermally compressing the two sheets of the separator having the metal mesh inserted.

3. The method for evaluating the insulating performance of a separator for an electrochemical device according to claim 1, wherein the metal contact layer of the measurement subject includes a metal particle layer comprising a plurality of metal particles, and wherein the preparing the measurement subject comprises:
    scattering the plurality of metal particles onto one of the two sheets of the separator; and
    forming the plurality of local contacts between the separator and the plurality of metal particles by positioning the other separator on the separator onto which the plurality of metal particles have been scattered.

4. The method for evaluating the insulating performance of a separator for an electrochemical device according to claim 1, wherein the metal contact layer of the measurement subject includes a metal particle layer comprising a plurality of metal particles and an organic binder binding them, and wherein the preparing the measurement subject comprises:
    preparing a slurry comprising the plurality of metal particles, the organic binder and a volatile solvent;
    forming a metal contact layer by coating the slurry onto one of the two sheets of the separator and drying the same; and
    forming the plurality of local contacts between the separator and the plurality of metal particles by positioning the other separator on the separator onto which the metal contact layer has been formed and then thermally compressing the two sheets of the separator.

5. The method for evaluating the insulating performance of a separator for an electrochemical device according to claim 1, wherein the area of the metal contact layer is 60-70% of the total area of the separator, and the metal contact layer is formed with a predetermined spacing from the edge of the separator.

6. The method for evaluating the insulating performance of a separator for an electrochemical device according to claim 2, wherein the metal mesh has a diameter of a weft and a warp of 15-2000 µm and a gap between the weft and the warp of 15-10000 µm.

7. The method for evaluating the insulating performance of a separator for an electrochemical device according to claim 3, wherein the metal particle comprised in the metal particle layer has a size of 15-1000 µm.

8. The method for evaluating the insulating performance of a separator for an electrochemical device according to claim 1, wherein, in the determining the voltage value, when the current measurement value is equal to or greater than the critical value for a preset reference time, the control unit determines the voltage value measured immediately after the reference time has passed as a dielectric breakdown voltage.

9. The method for evaluating the insulating performance of a separator for an electrochemical device according to claim 1, which further comprises, after the applying the voltage and before the receiving the current measurement value, interposing metal foils between the measurement subject and the upper jig and between the measurement subject and the lower jig.

10. The method for evaluating the insulating performance of a separator for an electrochemical device according to claim 1, wherein, in the applying the voltage, the measurement subject is compressed by applying pressure to the upper jig and the lower jig.

11. The method for evaluating the insulating performance of a separator for an electrochemical device according to claim 1, wherein, in the applying the voltage, at least one of the upper jig and the lower jig is heated.

12. The method for evaluating the insulating performance of a separator for an electrochemical device according to claim 10, wherein the pressure applied the upper jig and the lower jig is 5 kPa to 30 MPa.

13. The method for evaluating the insulating performance of a separator for an electrochemical device according to claim 1, which further comprises recording the determined dielectric breakdown voltage in a storage unit.

14. The method for evaluating the insulating performance of a separator for an electrochemical device according to claim 1, which further comprises displaying the determined dielectric breakdown voltage by a display unit.

15. The method for evaluating the insulating performance of a separator for an electrochemical device according to claim 1, wherein the voltage is a DC voltage or a pulse voltage the magnitude of which increases with time.

* * * * *